US012723307B2

(12) United States Patent
Wong et al.

(10) Patent No.: US 12,723,307 B2
(45) Date of Patent: Sep. 1, 2026

(54) DRAM DEVICES HAVING MOLYBDENUM SULFIDE CHANNEL

(71) Applicant: Applied Materials, Inc., Santa Clara, CA (US)

(72) Inventors: Keith T. Wong, Mountain View, CA (US); Hyojin Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 18/378,425

(22) Filed: Oct. 10, 2023

(65) Prior Publication Data

US 2024/0035152 A1 Feb. 1, 2024

Related U.S. Application Data

(62) Division of application No. 17/028,156, filed on Sep. 22, 2020, now Pat. No. 11,821,079.

(60) Provisional application No. 62/903,900, filed on Sep. 22, 2019.

(51) Int. Cl.

| | |
|---|---|
| ***C23C 16/30*** | (2006.01) |
| ***C23C 16/02*** | (2006.01) |
| ***C23C 16/455*** | (2006.01) |
| ***C23C 16/56*** | (2006.01) |
| ***H10B 12/00*** | (2023.01) |
| ***H10D 30/67*** | (2025.01) |

(52) U.S. Cl.

CPC ........ *C23C 16/305* (2013.01); *C23C 16/0227* (2013.01); *C23C 16/45553* (2013.01); *C23C 16/56* (2013.01); *H10B 12/00* (2023.02); *H10D 30/675* (2025.01)

(58) Field of Classification Search

CPC .............................. C23C 16/305; H10B 12/00

See application file for complete search history.

(56) References Cited

U.S. PATENT DOCUMENTS

| | | | |
|---|---|---|---|
| 4,975,340 A | 12/1990 | Suhr et al. | |
| 6,521,349 B1 | 2/2003 | Konig et al. | |
| 2003/0118864 A1 | 6/2003 | Kosyachkov | |
| 2003/0138172 A1 | 7/2003 | Toshikazu et al. | |
| 2012/0289063 A1 | 11/2012 | Sato et al. | |
| 2013/0048952 A1 * | 2/2013 | Chen ..................... | C01B 32/194 257/29 |

(Continued)

FOREIGN PATENT DOCUMENTS

| | | | |
|---|---|---|---|
| CN | 102691024 A | 9/2012 | |
| CN | 108677162 A | 10/2018 | |
| WO | WO-2018182714 A1 * | 10/2018 | ............. H10D 30/67 |

OTHER PUBLICATIONS

"Electronic properties of MoS2/MoOx interfaces: Implications in Tunnel Field Effect Transistors and Hole Contact", Scientific Reports, pp. 1-7 (Year: 2016).*

(Continued)

*Primary Examiner* — Nelson Garces

(74) *Attorney, Agent, or Firm* — SERVILLA WHITNEY LLC

(57) ABSTRACT

Methods of depositing a molybdenum sulfide film with increased sulfur:molybdenum ratio are described. The methods include pre-cleaning a dielectric material with oxygen radicals prior to formation of a molybdenum sulfide film that has a lower oxygen content than would be formed without the pre-cleaning.

7 Claims, 1 Drawing Sheet

(56) References Cited

U.S. PATENT DOCUMENTS

| | | | |
|---|---|---|---|
| 2013/0068613 | A1 | 3/2013 | Hu et al. |
| 2014/0127422 | A1 | 5/2014 | Shouqian et al. |
| 2016/0168694 | A1 | 6/2016 | Min |
| 2017/0059514 | A1 | 3/2017 | Hoffman |
| 2017/0175258 | A1 | 6/2017 | Robinson et al. |

OTHER PUBLICATIONS

Hellstern, Thomas R., et al., "Molybdenum Disulfide Catalytic Coatings via Atomic Layer Deposition for Solar Hydrogen Production u from Copper Gallium Diselenide Photocathodes", ACS Appl. Energy Mater. 2019, 2, 1060-1066.

Kwon, Do Hyun, et al., "A comprehensive study on atomic layer deposition of molybdenum sulfide for electrochemical hydrogen u evolution", Nanoscale, 2016, 8, 7180-7188.

Liu, Lei , et al., "Layer-controlled precise fabrication of ultrathin MoS2 films by atomic layer deposition", Nanotechnology 28 (2017) 195605 pp. 1-7.

Mane, Anil U., et al., "Atomic layer deposition of molybdenum disulfide films using MoF6 and H2S", J. Vac. Sci. Technol. A 36, 01A125 (2018) pp. 1-9.

Mattinen, Miika, et al., "Atomic Layer Deposition of Crystalline MoS2 Thin Films: New Molybdenum Precursor for Low-Temperature Film Growth", Adv. Mater. Interfaces 2017, 4, 1700123, pp. 1-11.

Merki, Daniel , et al., "Amorphous molybdenum sulfide films as catalysts for electrochemical hydrogen production in water", Chemical Science, 2011, 2, 1262-1267.

Merki, Daniel , et al., "Fe, Co, and Ni ions promote the catalytic activity of amorphous molybdenum sulfide films for hydrogen evolution", Chemical Science, 2012, 3, 2515-2525.

Valdivia, Arturo , et al., "Atomic layer deposition of two dimensional MoS2 on 150 mm substrates", Journal of Vacuum Science & Technology A 34 (2), 021515 (2016), pp. 1-6.

Yang, J.J., et al., "Ultrathin molybdenum disulfide (MoS2) film obtained in atomic layer deposition: A mini-review", Sci China Tech Sci, Nov. 2021, vol. 64 No. 11, pp. 2347-2359.

* cited by examiner

DRAM DEVICES HAVING MOLYBDENUM SULFIDE CHANNEL

CROSS-REFERENCE TO RELATED APPLICATIONS

This application is a Divisional Application of U.S. patent application Ser. No. 17/028,156, filed Sep. 22, 2020, which claims priority U.S. Provisional Application No. 62/903,900, filed Sep. 22, 2019, the entire disclosures of which are hereby incorporated by reference herein.

TECHNICAL FIELD

The present disclosure relates to methods of depositing a molybdenum sulfide layer. In particular, embodiments of the disclosure relate to methods for forming a monolayer or a few layers of molybdenum sulfide on a dielectric substrate surface.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices Molybdenum sulfide ($MoS_2$) is considered for use in multiple applications. For example, molybdenum sulfide is as a channel material in both logic transistors and DRAM transistors. Additionally, molybdenum sulfide may be used in 3D NAND devices as the channel or floating gate.

Molybdenum sulfide is generally deposited by atomic layer deposition (ALD) on dielectric materials. The process typically uses no pre-cleaning or pre-treatment procedure. The resulting deposited layers have a molybdenum:sulfur ratios of about 1:1.5, rather than the stoichiometric 1:2 expected. Additionally, deposition creates a molybdenum oxide ($MoO_3$) layer on the dielectric. The low Mo:S ratio along with high $MoO_3$ content contributes to less preferred electrical properties including low charge carrier mobility.

Therefore, there is a need in the art for methods for depositing molybdenum sulfide with improved electrical properties.

SUMMARY

One or more embodiments of the disclosure are directed to methods of depositing a molybdenum sulfide film. A dielectric material on a substrate is precleaned with oxygen radicals to form a clean dielectric material. A molybdenum sulfide film is formed on the clean dielectric material.

Additional embodiments of the disclosure are directed to methods of depositing a molybdenum sulfide film. A dielectric material formed on a substrate is precleaned with oxygen radicals. The dielectric material comprises one or more of silicon dioxide ($SiO_2$) or aluminum oxide ($Al_2O_3$). The radicals are generated with a remote plasma source at a temperature in the range of room temperature to 200° C. in an environment consisting essentially of one or more of oxygen ($O_2$) or water vapor ($H_2O$) to form a clean dielectric material. A molybdenum sulfide film is deposited on the clean dielectric material by atomic layer deposition using a molybdenum organometallic precursor and a sulfur-containing reactant. The molybdenum sulfide film is annealed by rapid thermal processing (RTP) at 900° C. in a nitrogen ($N_2$) environment to form an annealed molybdenum sulfide film having grain size greater than or equal to 30 Å and a molybdenum:sulfur ratio in the range of 1:1.9 to 1:2.5 and a thickness in the range of 1 nm to 5 nm.

Further embodiments of the disclosure are directed to DRAM devices comprising a dielectric material, a molybdenum oxide interfacial layer on the dielectric material, and a molybdenum sulfide channel formed on the molybdenum oxide interfacial layer. The molybdenum oxide interfacial layer has a thickness less than 1 nm. The molybdenum sulfide channel has a molybdenum:sulfur ratio in the range of 1:1.9 to 1:2.5 and a thickness in the range of 1 nm to 5 nm.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, silicon dioxide, strained silicon, silicon on insulator (SOI), carbon doped silicon oxides, amorphous silicon, doped silicon, and any other materials such as metals, metal nitrides, metal alloys, and other conductive materials including aluminum oxide, depending on the application. Substrates include, without limitation, DRAM devices. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Atomic layer deposition of molybdenum sulfide typically does not pre-clean or pre-treat the substrate surface. One or more embodiments of the present disclosure provide methods for depositing a molybdenum sulfide film. In some embodiments, the method comprises pre-cleaning or pre-treating a dielectric material on a substrate with oxygen radicals to form a clean dielectric material and depositing a molybdenum sulfide film on the clean dielectric material.

Some embodiments include generating oxygen radicals. In some embodiments, the oxygen radicals are generated using a remote plasma source. In some embodiments, the oxygen radical are generated by passing an oxygen-containing gas over a hot wire (for example, a heated tungsten wire).

Surfaces treated with oxygen radicals are expected to have increased oxide content. Depositing a film on a surface with a high oxide content would be expected to have a higher oxygen content or an interfacial region with a higher oxygen content. However, the inventors surprisingly found that depositing a film according to the present disclosure results in a film with less oxide content than a film deposited on the untreated substrate surface.

Figure 1:
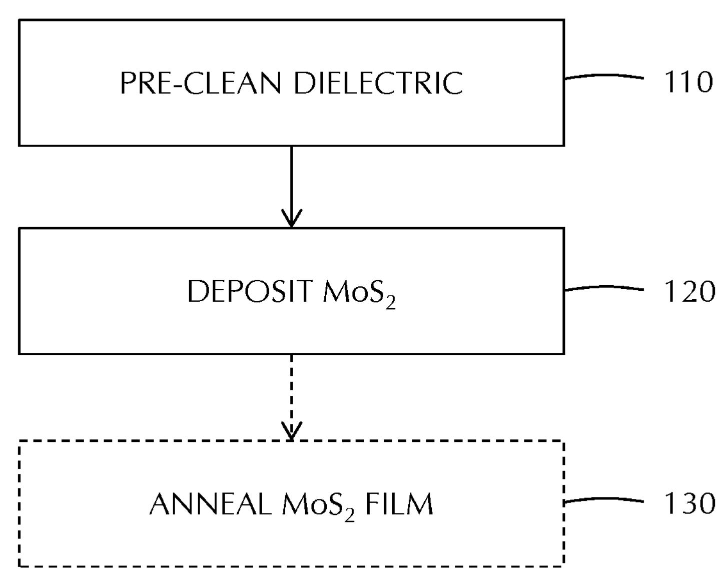
FIG. 1 illustrates a process flow diagram of a method according to one or more embodiments.
Figure 2:
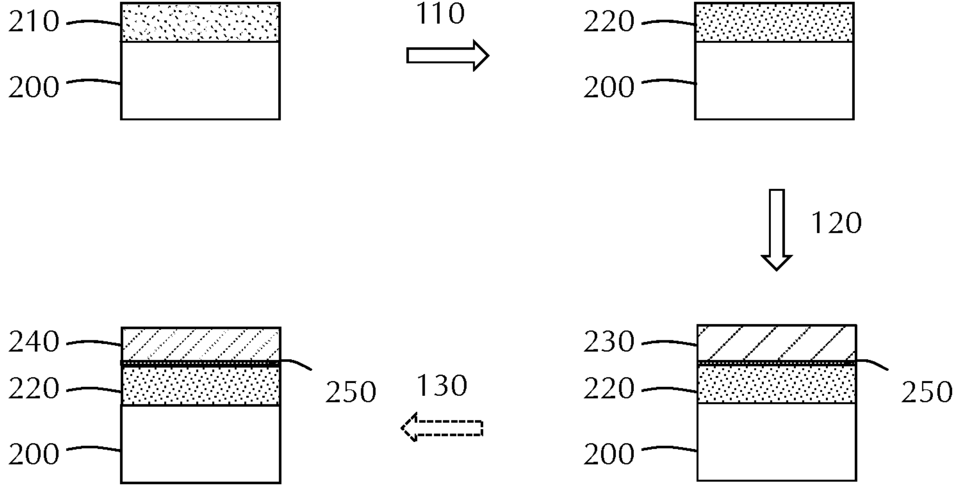
FIG. 2 illustrates a schematic representation of the method according to one or more embodiment.

FIG. 1 illustrates a flowchart of an embodiment of the method 100 according to one or more embodiment of the disclosure. FIG. 2 illustrates a representative portion of a substrate during processing according to the method 100 of some embodiments.

According to one or more embodiment, method 100 begins with a substrate 200 with a dielectric material 210 formed thereon. The dielectric material 210 can be any suitable dielectric material formed by any suitable technique known to the skilled artisan. In some embodiments, the dielectric material comprises one or more of silicon oxide or aluminum oxide.

As used in this specification and the appended claims, the term "silicon oxide" or "SiO" refers to a material with silicon and oxygen atoms and does not imply any particular stoichiometric relationship. A "silicon oxide" or "SiO" film has the sum of the silicon atoms and oxygen atoms greater than or equal to 95%, 98%, 99% or 99.5% on an atomic basis. A "silicon dioxide" film or "$SiO_2$" film has a target stoichiometric ratio of of silicon:oxygen atoms of 1:2. However, the skilled artisan will recognize that the actual stoichiometric ratio of the silicon and oxygen atoms depends on a number of factors, including, but not limited to, the method of forming the film.

As used in this specification and the appended claims, the term "aluminum oxide" or "AlO" refers to a material with aluminum and oxygen atoms and does not imply any particular stoichiometric relationship. An "aluminum oxide" or "AlO" film has the sum of the aluminum atoms and oxygen atoms greater than or equal to 95%, 98%, 99% or 99.5% on an atomic basis. An "alumina" or "$Al_2O_3$" film has a target stoichiometric ratio of aluminum:oxygen atoms of 2:3. However, the skilled artisan will recognize that the actual stoichiometric ratio of the aluminum and oxygen atoms depends on a number of factors, including, but not limited to, the method of forming the film.

The dielectric material 210 is pre-cleaned (also referred to as pre-treated) with oxygen radicals in pre-cleaning process 110 to form a clean dielectric material 220. In some embodiments, the oxygen radicals (which may be O* or $O_2$*, or other suitable oxygen species) are generated by a remote plasma source (RPS) and flowed into the process chamber with the substrate 200. In some embodiments, the oxygen radicals are generated by passing an oxygen-containing gas across a hot wire. As used in this manner, the term "hot wire" refers to a heated filament of a material inert to the oxygen-containing gas. In some embodiments, the hot wire comprises a metallic tungsten filament. In some embodiments, the dielectric material 210 is pre-cleaned or pre-treated by direct exposure to an $O_2$ plasma. In some embodiments, the plasma is a conductively coupled plasma (CCP) and/or an inductively coupled plasma (ICP).

In one or more embodiments, oxygen radicals are formed from a flow of an oxygen-containing gas. In some embodiments, the oxygen-containing gas comprises one or more of oxygen ($O_2$; also referred to as molecular oxygen), ozone ($O_3$), water vapor ($H_2O$), nitrogen oxide ($NO_x$; where x is 1-3) or carbon oxide ($CO_x$; where x is 1 or 2). In some embodiments, the oxygen-containing gas consists essentially of one or more of oxygen ($O_2$), ozone ($O_3$) or water vapor ($H_2O$). As used in this specification and the appended claims, the term "consists essentially of" means that the sum of the stated species makes up greater than or equal to 95%, 98%, 99% or 99.5% of the gaseous species, on a molar basis. In some embodiments, the oxygen-containing gas is not diluted or co-flowed with an inert or carrier gas.

During the pre-cleaning process 110, the substrate 200 is maintained at a pre-cleaning temperature. In some embodiments, the substrate is maintained at a temperature in the range of 4° C. to 250° C., or in the range of 10° C. to 235° C., or in the range of 15° C. to 220° C. or in the range of room temperature to 200° C. during the pre-cleaning process 110. As used herein, "room temperature" refers to a temperature range of 20° C. to 25° C.

The substrate 200 can be exposed to the pre-cleaning process 110 for any suitable amount of time. In some embodiments, the dielectric material 210 is exposed to the pre-cleaning process 110 for a time in the range of 5 to 90 seconds, or in the range of 6 to 60 seconds, or in the range of 7 to 55 seconds, or in the range of 8 to 50 seconds, or in the range of 9 to 45 seconds, or in the range of 10 to 40 seconds. In some embodiments, the dielectric material 210 is exposed to the pre-cleaning process 110 for greater than or equal to 2 seconds, 5 seconds or 15 seconds. In some embodiments, exposure to the pre-cleaning process 110 for a time period less than 100 seconds, 90 seconds, 80 seconds, 70 seconds, 60 seconds, 50 seconds, 40 seconds, 30 seconds or 20 seconds.

After forming the clean dielectric material 220 in the pre-cleaning process 110, a molybdenum sulfide film 230 is formed in deposition process 120. The molybdenum sulfide film 230 can be deposited by any suitable technique known to the skilled artisan. In some embodiments, the molybdenum sulfide film 230 is deposited by atomic layer deposition or chemical vapor deposition (CVD) using a molybdenum precursor and a sulfur-containing reactant. In some embodiments, the method of depositing molybdenum sulfide film 230 comprises sequential exposure of the substrate 200 and clean dielectric film 220 to a molybdenum organometallic complex and a sulfur reactant. In some embodiments, the molybdenum precursor comprises one or more of molybdenum hexacarbonyl ($Mo(CO)_6$), molybdenum pentachloride ($MoCl_5$), molybdenum hexafluoride ($MoF_6$), tetrakis(dimethylamido)molybdenum (IV) ($Mo(NMe_2)_4$, bis(t-butylimido)bis(dimethylamino)molybdenum(VI) ($Mo(NtBu)_2(NMe_2)_2$), or bis(t-butylimido)bis(diethylamino) molybdenum(VI) ($Mo(NtBu)_2(NEt_2)_2$). In some embodiments, the sulfur reactant comprises one or more of dihydrogen sulfide ($H_2S$), dimethyl disulfide, diethyl disulfide, ethane dithiol or bis(trimethylsilyl)sulfide ($S(SiMe_3)_2$).

Deposition of molybdenum sulfide on an untreated dielectric surface results in a film with a molybdenum:sulfur ratio of about 1:1.5 instead of the expected 1:2 ratio of $MoS_2$. In some embodiments, the molybdenum sulfide film 230 results in the film having a molybdenum:sulfur ratio in the range of 1:17 to 1:3, or in the range of 1:1.8 to 1:2.75, or in the range of 1:1.9 to 1:2.5. In some embodiments, the molybdenum sulfide film 230 has a sulfer:molybden ratio greater than 1.6, 1.7, 1.8, 1.9 or 2.0.

In some embodiments, the molybdenum sulfide film 230 is deposited by atomic layer deposition. In some embodiments, the molybdenum sulfide film 230 is deposited using in the range of 1 to 15 ALD cycles, or in the range of 2 to 14 ALD cycles, or in the range of 4 to 12 ALD cycles (where each ALD cycle comprises sequential and separate exposures to a molybdenum precursor and a sulfur reactant.) In some embodiments, the molybdenum sulfide film 230 is deposited to a thickness in the range of 0.5 nm to 10 nm, or in the range of 1 nm to 5 nm.

During the deposition process 120, the substrate 200 is maintained at a deposition temperature. In some embodiments, the substrate is maintained at a temperature in the range of 4° C. to 250° C., or in the range of 10° C. to 235° C., or in the range of 15° C. to 220° C. or in the range of room temperature to 200° C. during the pre-cleaning process 110. In some embodiments, the substrate 200 is maintained at the same temperature during the pre-cleaning process 110 and the deposition process 120. In some embodiments, the substrate 200 is maintained at different temperatures during the pre-cleaning process 110 and the deposition process 120.

The deposition process 120 of some embodiments is performed in the same processing chamber as the pre-cleaning process 110. In some embodiments, the deposition process 120 is performed in a different processing chamber than the pre-cleaning process 110. In some embodiments, the pre-cleaning and deposition process chambers are connected to the same cluster tool and the substrate is maintained under vacuum conditions during transfer from the pre-cleaning chamber to the deposition chamber.

In some embodiments, the method 100 proceeds with an optional annealing 130. In FIGS. 1 and 2, annealing 130 is indicated as being optional by use of dotted lines. In some embodiments, the molybdenum sulfide film 230 is annealed to form an annealed molybdenum sulfide film 240.

Annealing 130 the molybdenum sulfide film 230 can be performed by any suitable technique known to the skilled artisan. In some embodiments, annealing 130 the molybdenum sulfide film 230 is performed at a temperature greater than or equal to 500° C., 600° C., 700° C., 800° C., 900° C., or 1000° C.

In some embodiments, the molybdenum sulfide film 230 is annealed 130 in an inert environment. In some embodiments, the inert environment comprises one or more of Ar, $N_2$, He, Ne or Kr gas.

In some embodiments, the molybdenum sulfide film 230 is annealed 130 in a hydrogen sulfide ($H_2S$) environment. In some embodiments, the molybdenum sulfide film 230 is annealed in an environment comprising elemental sulfur or molecular sulfur.

In other embodiments, the annealing 130 the molybdenum sulfide film comprises annealing by rapid thermal processing (RTP), also referred to as rapid thermal annealing (RTA) in which the temperature of the substrate is rapidly increased to at least 500° C., 600° C., 700° C., 800° C., 900° C., 1000° C., 1100° C., or 1200° C. in a nitrogen ($N_2$) environment, at a heating rate greater than or equal to 25° C./second or 50° C./second. In some embodiments, annealing the molybdenum sulfide film comprises annealing with a very slow heating rate (e.g., less than 10° C./second).

In some embodiments, the molybdenum sulfide film 230 is substantially amorphous. As used in this manner, "substantially amorphous" means at least 55%, at least 60%, at least 65%, at least 70%, at least 75%, at least 80%, at least 85%, at least 90%, or at least 95% of the film is amorphous. In some embodiments, annealing 130 the molybdenum sulfide film 230 forms an annealed molybdenum sulfide film 240 with crystals having a grain size greater than or equal to 30 Å, greater than or equal to 40 Å, greater than or equal to 50 Å, greater than or equal to 60 Å, greater than or equal to 70 Å, greater than or equal to 80 Å, greater than or equal to 90 Å, greater than or equal to 100 Å, or greater than or equal to 110 Å. In some embodiments, the annealed molybdenum sulfide film 240 has crystals with a grain size in a range of 30 Å to 40 Å, 35 Å to 45 Å, 40 Å to 50 Å, 45 Å to 55 Å, 50 Å to 60 Å, 55 Å to 65 Å, 60 Å to 70 Å, 65 Å to 75 Å, 70 Å to 80 Å, 75 Å to 85 Å, 80 Å to 90 Å, 85 Å to 95 Å, 90 Å to 100 Å, 95 Å to 105 Å, or 100 Å to 110 Å. In some embodiments, the annealed molybdenum sulfide film 240 has crystals with a grain size in the range of 70 Å to 250 Å, or in the range of 80 Å to 225 Å or in the range of 90 Å to 200 Å.

In some embodiments, the molybdenum sulfide film 230 comprises an initial molybdenum content, an initial sulfur content and an initial carbon content and annealing 130 reduces the carbon content to less than or equal to 50%, less than or equal to 45%, less than or equal to 40%, less than or equal to 35%, less than or equal to 30%, less than or equal to 25%, less than or equal to 20%, less than or equal to 15%, less than or equal to 10%, or less than or equal to 5% of the initial carbon content.

In some embodiments, the method 100 forms a molybdenum sulfide film 230 or annealed molybdenum sulfide film 240 with a lower oxygen content than a similarly deposited film without pre-cleaning the substrate. In some embodiments, the method 100 forms a molybdenum sulfide film 230 or an annealed molybdenum sulfide film 240 with a higher sulfur:molybdenum ratio than a similarly deposited film without pre-cleaning 110. As used in this manner, a "similarly deposited film" means a film deposited and, optionally, annealed using the same deposition and annealing parameters.

In some embodiments, a molybdenum sulfide film 230 deposited with five ALD cycles and annealed at 900° C. in a nitrogen ($N_2$) ambient by RTP has a S:Mo ratio greater than 1.3. In some embodiments, a molybdenum sulfide film 230 deposited with ten ALD cycles and annealed at 900° C. in a nitrogen ($N_2$) ambient by RTP has a S:Mo ratio greater than 1.75. In some embodiments, a molybdenum sulfide film 230 deposited with twenty ALD cycles and annealed at 900° C. in a nitrogen ($N_2$) ambient by RTP has a S:Mo ratio greater than 1.9.

In some embodiments, a molybdenum oxide interfacial layer 250 forms between the dielectric material 220 and the molybdenum sulfide film 230 or the annealed molybdenum sulfide film 240. In some embodiments, the molybdenum oxide interfacial layer 250 has a thickness less than 5 Å, 4 Å, 3 Å, 2 Å or 1 Å.

In one or more embodiments, the method of depositing molybdenum sulfide film forms a channel material in a DRAM device.

Another aspect of the present disclosure includes a DRAM device comprising a dielectric material 220, a molybdenum oxide interfacial layer 250 on the dielectric material 220, and a molybdenum sulfide film 240 as a channel formed on the molybdenum oxide interfacial layer 250. In some embodiments, the molybdenum oxide interfacial layer 250 has a thickness less than 0.5 nm, less than 1 nm, less than 2 nm, less than 3 nm, less than 4 nm, less than 5 nm, or less than 6 nm.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A DRAM device comprising:

a dielectric material;

a molybdenum oxide interfacial layer on the dielectric material; and a molybdenum sulfide channel on the molybdenum oxide interfacial layer, wherein the molybdenum sulfide channel is substantially amorphous.

2. The DRAM device of claim 1, wherein the dielectric material comprises one or more of silicon dioxide ($SiO_2$) or aluminum oxide ($Al_2O_3$).

3. The DRAM device of claim 1, wherein the molybdenum oxide interfacial layer has a thickness less than 1 nm.

4. The DRAM device of claim 1, wherein the molybdenum sulfide channel has a molybdenum:sulfur ratio in the range of 1:1.9 to 1:2.5.

5. The DRAM device of claim 1, wherein the molybdenum sulfide channel has a thickness in the range of 1 nm to 5 nm.

6. The DRAM device of claim 1, formed in a single processing chamber.

7. A DRAM device comprising:

a dielectric material comprising one or more of silicon dioxide ($SiO_2$) or aluminum oxide ($Al_2O_3$);

a molybdenum oxide interfacial layer on the dielectric material, the molybdenum oxide interfacial layer having a thickness less than 1 nm; and a molybdenum sulfide channel on the molybdenum oxide interfacial layer, the molybdenum sulfide channel having a molybdenum:sulfur ratio in the range of 1:1.9 to 1:2.5 and a thickness in the range of 1 nm to 5 nm, and the molybdenum sulfide channel is substantially amorphous.

* * * * *